United States Patent [19]

Ameurlaine et al.

[11] 3,930,161

[45] Dec. 30, 1975

[54] RADIATION DETECTOR HAVING A MOSAIC STRUCTURE

[75] Inventors: Jacques François Ameurlaine, Paris; Michel Benoît Sirieix, Jouy-en-Josas, both of France

[73] Assignee: Societe Anonyme de Telecommunications, Paris, France

[22] Filed: Mar. 18, 1974

[21] Appl. No.: 452,468

[30] Foreign Application Priority Data

Apr. 4, 1973 France .............................. 73.12067

[52] U.S. Cl. .................. 250/370; 250/338; 357/30; 357/56

[51] Int. Cl.²......................... G01T 1/22; G01J 1/00

[58] Field of Search ........... 250/336, 338, 340, 370, 250/371; 357/30, 56

[56] References Cited

UNITED STATES PATENTS

| | | | |
|---|---|---|---|
| 3,516,728 | 6/1970 | Fenner | 357/30 X |
| 3,551,763 | 12/1970 | Hakki | 357/56 X |
| 3,707,657 | 12/1972 | Veith | 357/56 X |
| 3,793,571 | 2/1974 | Janssen | 357/30 X |

*Primary Examiner*—Archie R. Borchelt
*Attorney, Agent, or Firm*—Holman & Stern

[57] ABSTRACT

An infra-red radiation detector comprising an n-type semi-conductor block on which are disposed in the form of projections small elementary p-type semi-conductor blocks, thereby creating a matricial network of elementary junctions, wherein the sensitive face of said detector is the free face of said n-type semi-conductor block which is parallel to the plane of the elementary junctions.

7 Claims, 9 Drawing Figures

RADIATION DETECTOR HAVING A MOSAIC STRUCTURE

The present invention relates to a radiation detector whose sensitive surface is formed by the association of a plurality of elementary sensitive surfaces and whose active elements is the junction of a semi-conductor body.

Such radiation detectors are known. In particular, a detector is known in which elementary detectors which are independent from each other are associated in the form of a matrix, each of said elementary detectors consisting of an n-type doped region and a p-type doped region, each of which is provided with a connecting wire. When a point incident radiation is received on the sensitive surface of such a detector, only one of the elementary detectors has a difference of potential between its two connections and this enables the point of impact of said radiation on the detector to be located.

Other detectors also of a known type are such that the n-regions of the elementary detectors form a single semi-conductor block of n-type on which there are located in the form of individual projections, the p-regions of the elementary detectors. This arrangement is known under the name of a mesa structure and in this case the connection situated on the n-type block is single and each p projection has its own connection. The free surface of each p projection constitutes the incident face so that the optical division and the electrical division are effected by the p projections.

In the two aforementioned cases, the connecting wires must be fixed in the plane of the sensitive surface and this very much decreases the effective surface of the sensitive face of the detector.

An object of the present invention is to overcome this drawback of known detectors. The invention provides a detector of the mesa type constituted by an n-type semiconductor block on which are situated, in the form of projections, small elementary p-type semi-conductor blocks thereby creating a matricial network of elementary junctions, wherein the sensitive face of the detector is the free face of said n-type semi-conductor block which is parallel to the plane of the elementary junctions.

In a preferred embodiment, the connecting wire common to all the elementary detectors is connected to the n-type semi-conductor block in such manner as not decrease the sensitive surface of the detector, and the connecting wire pertaining to each elementary detector is fixed to the p-region by soldering to the outer face of the projections, which face is parallel to the plane of the junctions and may be entirely covered by said solder.

Preferably, said sensitive face of the detector is secured to a support performing at least one of the following functions: electric conductor, thermic conductor, protective layer and optical condenser.

The construction of the detector according to the invention is made possible by the application to the n-type doped region of the "window" effect. This effect, in accordance with which the n-type doped region allows through the radiation to be detected in the same way as a window, is well known. It has been described by Moss and Burstein in the book entitled "Energy Band in Semi-conductors" and edited in 1968 in New-York by Wiley.

The detector according to the invention has many advantages. In particular, as has already been mentioned, the ratio between the effective surface area and the total surface area of the sensitive face is maximum. This totally sensitive surface, which is parallel and therefore equal to the surface of the junction, produces a large inverse impedance of the detector and good detection capability.

As the detection of incident photons takes place in the p-type projections, which are insulated from each other, the detector according to the invention has the advantage of having a very low optical diaphony between the elementary detectors of which it is composed.

According to another advantage of the detector according to the invention, the outer surface of the junction can be rendered passive or protected by thin layers which are of material opaque to infra-red such as SiO, $SiO_2$ or Teflon, which layers are much more mechanically and physically resistant than those usually employed such as layers of zinc sulphide. A final coating with an epoxy resin may still further increase the protection and consequently the reliability of the detector according to the invention.

Further features and advantages of the detector according to the invention will appear from the ensuing description with reference to the accompanying drawing in which.

By way of a non-limitative example, the detector according to the invention was constructed by employing the semi-conductor body Hg Te, Cd Te which, when cooled to the temperature of liquid nitrogen, is particularly well adapted to the detection of infra-red radiation of 10.6 microns wavelength.

Figure 1:
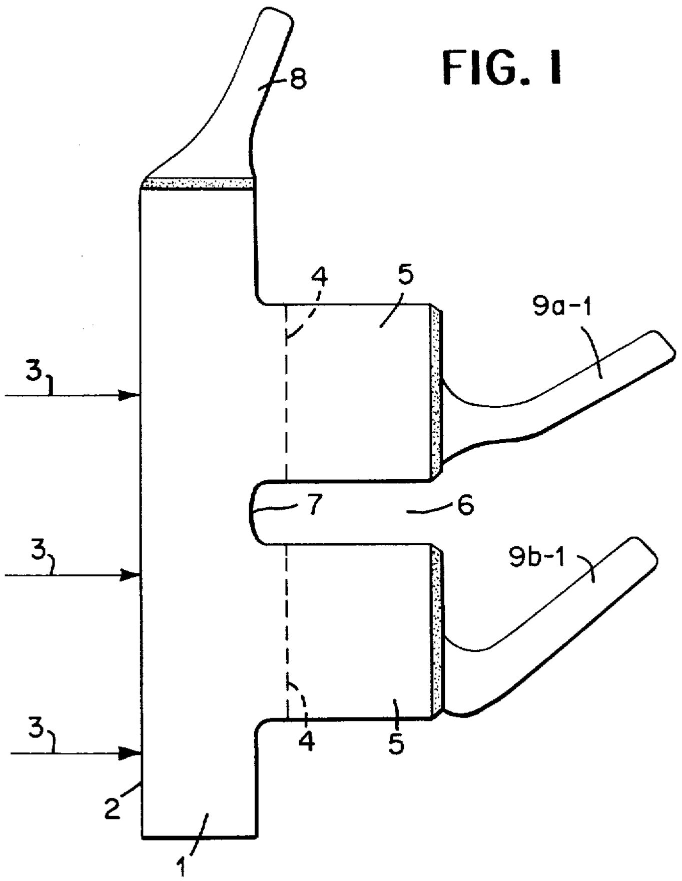
FIG. 1 is a cross-sectional view of a detector according to the invention.

FIG. 1 is a sectional view of such a detector. The n-type doped region 1 has a plane face 2 which is the sensitive face of the detector. This face receives the radiation 3 to be detected and will be placed perpendicular to this radiation. A junction 4, parallel to the face 2 and shown in dotted line, separates the n-type doped region 1 from a p-type doped region 5; the latter region is in the form of elementary projections separated from each other by a squared pattern of recesses 6 the depth of which is sufficient to bare the n-region in a separation region 7. A first electric connection 8, common to all the elementary detectors, is secured, by way of a non-limitative example, to the lateral face of the n-type doped region 1 so as not to encroach upon the face 2. The second connection 9*a*-1 and 9*b*-1, individual for each elementary detector is secured to the rear face of the p-doped region 5, this face also being parallel to the sensitive face of the detector and, therefore, to the junction 4. These connections may be secured by known means and present no particular difficulty.

Figure 2:
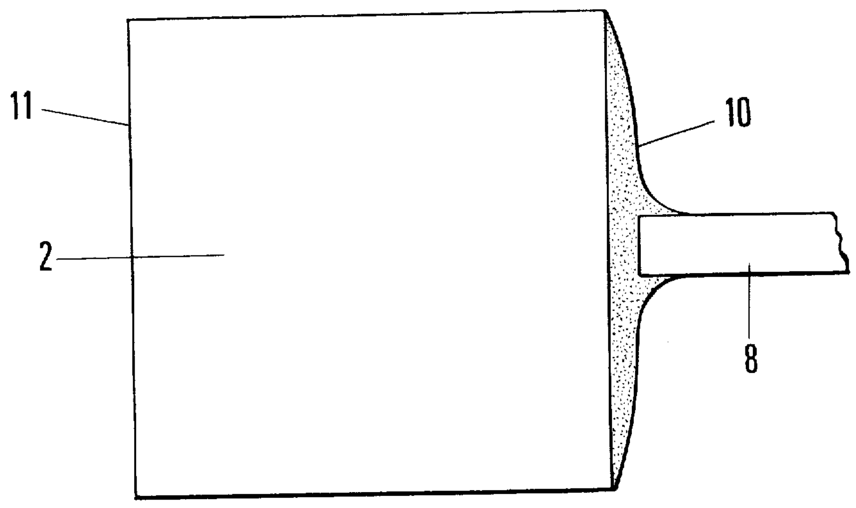
FIG. 2 is a plan view of the front face of sensitive face of the detector according to the invention.

FIG. 2 shows the front face 2 of the detector according to the invention. This face is in the form of a perfectly planar square. This face is the sensitive face of the detector and it will be noted that no solder, no connection, no passage for wire reduces its area. By way of a non-limitative example, the first electrical connection 8 of the detector according to the invention is secured to a lateral face of said detector by a solder 10.

Figure 3:
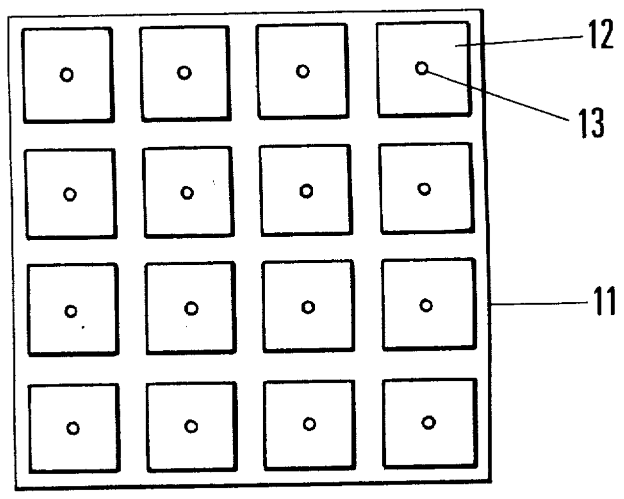
FIG. 3 is a plan view of the rear face of the detector according to the invention.

FIG. 3 shows the rear face of the detector according to the invention. On this face the p-type doped semi-conductor projections are here in the form of a square 12 and are disposed in rows and columns so as to constitute here, by way of example, a square matrix of sixteen elements. The section 13 of the second connection of the detector according to the invention is shown on each of these elements. By way of a non-limitative example, such a detector was constructed with p projections having a side dimension of 150 microns separated from each other by a distance of 50 microns. In this case, the sensitive face of the detector according to the invention is a square whose side 11 (FIGS. 2 and 3) measures 800 microns.

Figure 4:
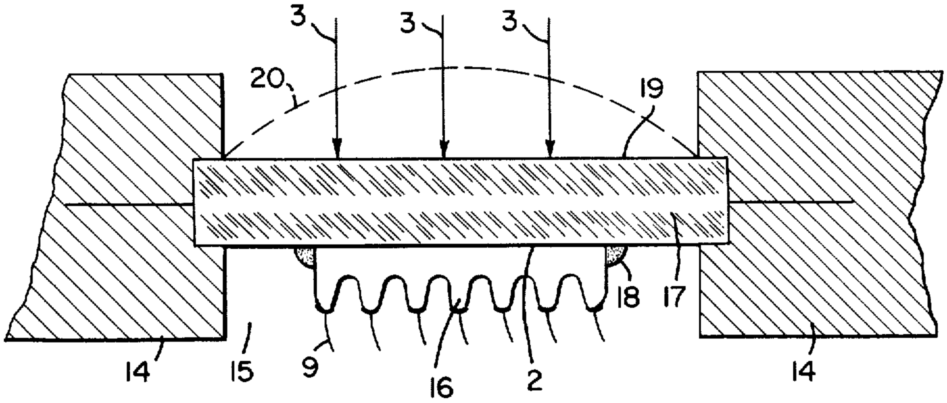
FIG. 4 is a sectional view of the mounting of a detector according to the invention on a cryostat which permits the utilization thereof.

FIG. 4 shows the mounting of a detector according to the invention in a cryostat which enables it to be employed at suitable temperature. The cryostat is of a known type and has not been fully represented in this figure. Merely a cold finger portion 14 of the cryostat has been shown in which an aperture 15 has been provided for the insertion of a detector 16. The latter has its sensitive face 2 adhered to a germanium plate 17 by means of an adhesive in a known manner. The radiation 3 to be detected impinges on the surface 19 of the germanium plate 17 mechanically secured to the cold finger member 14 of the cryostat. This germanium plate 17 may also act as a lens or a condensor and its face 19 then has an optically determined shape, for example the spherical dome shape shown by the dotted line 20. In the case of the assembly shown in FIG. 4, the first connection of the detector according to the invention is achieved by means of the germanium plate 17 and the cold finger member 14 of the cryostat.

Figure 5A:
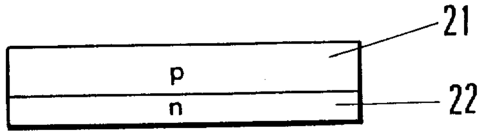
FIGS. 5*a* to 5*e* are diagrammatic sectional views of the detector according to the invention in the course of the different stages of its manufacture.
Figure 5B:
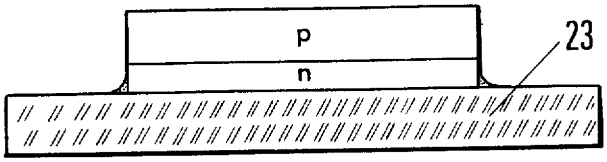
Figure 5C:
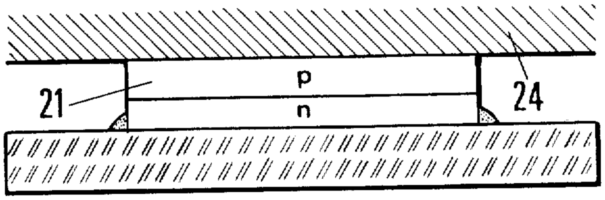

FIGS. 5a to 5e represent the successive stages of the manufacture of the detector according to the invention. Starting with a semi-conductor plate in which there has been formed, by diffusion or any other known means, a p-type region 21 and an n-type region 22 (FIG. 5a), this semi-conductor plate is then adhered to a support 23 of germanium which has been treated to impart to this suport certain optical qualities (FIG. 5b). The p-type doped region 21 is then machined by a tool 24 (FIG. 5c) to impart thereto the desired thickness and a suitable surface condition.

Figure 5D:
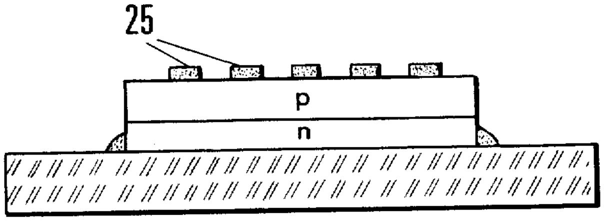
Figure 5E:
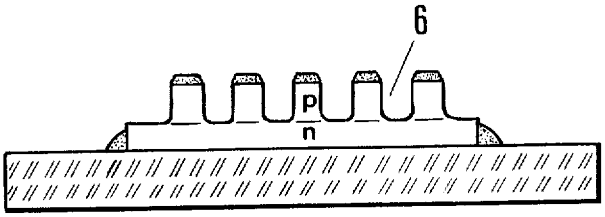

There are then produced by deposit the contact regions 25 on which are soldered the second connections of the detector according to the invention (FIG. 5d). These regions are then protected by known means before effecting a photo-engraving operation to produce the recesses 6 and obtain the finished detector (FIG. 5e).

After the soldering of the connections to the detector, protective layers are applied on its surface to the exclusion of its sensitive face which is protected by the germanium plate.

The detector according to the invention is particularly well adapted to the heterodyne detection of infrared radiations.

What we claim is:

1. An infra-red radiation detector comprising an n-type semi-conductor block on which are disposed in the form of projections small elementary p-type semi-conductor blocks, thereby creating a matricial network of elementary junctions, wherein the sensitive face of said detector is the free face of said n-type semi-conductor block which is parallel to the plane of the elementary junctions.

2. A detector according to claim 1, wherein the connecting wire common to all the elementary detectors is secured to the n-type semi-conductor block outside the sensitive surface of the detector, and the connecting wire pertaining to each elementary detector is secured to the p-type region by soldering to the outer face of the projections, which outer face is parallel to the plane of the junctions and is entirely covered by said solder.

3. A detector according to claim 1, wherein the sensitive face of the detector is secured to a support which is transparent to the radiation to be detected and performs the function of an electric conductor.

4. A detector according to claim 1, wherein the semi-conductor employed is Hg Te, Cd Te.

5. A detector according to claim 1, wherein the sensitive face of the detector is secured to a support which is transparent to the radiation to be detected and performs the function of a thermic conductor.

6. A detector according to claim 1, wherein the sensitive face of the detector is secured to a support which is transparent to the radiation to be detected and performs the function of a protective layer.

7. A detector according to claim 1, wherein the sensitive face of the detector is secured to a support which is transparent to the radiation to be detected and performs the function of an optical condenser.

* * * * *